(12) United States Patent
Adolf et al.

(10) Patent No.: US 10,135,549 B2
(45) Date of Patent: Nov. 20, 2018

(54) OPERATION OF A TRANSMISSION DEVICE OF A MAGNETIC RESONANCE DEVICE

(71) Applicants: Holger Adolf, Zirndorf (DE); Thomas Benner, Erlangen (DE); Hans-Peter Fautz, Forchheim (DE); Joerg Ulrich Fontius, Neunkirchen A. Brand (DE); Rene Gumbrecht, Herzogenaurach (DE)

(72) Inventors: Holger Adolf, Zirndorf (DE); Thomas Benner, Erlangen (DE); Hans-Peter Fautz, Forchheim (DE); Joerg Ulrich Fontius, Neunkirchen A. Brand (DE); Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 1258 days.

(21) Appl. No.: 14/251,595

(22) Filed: Apr. 12, 2014

(65) Prior Publication Data
US 2014/0307764 A1 Oct. 16, 2014

(30) Foreign Application Priority Data
Apr. 12, 2013 (DE) .................. 10 2013 206 570

(51) Int. Cl.
*H04B 17/00* (2015.01)
*G01R 33/36* (2006.01)
(Continued)

(52) U.S. Cl.
CPC ..... *H04B 17/0007* (2013.01); *G01R 33/3607* (2013.01); *H04B 17/12* (2015.01); *G01R 33/5612* (2013.01); *G01R 33/586* (2013.01)

(58) Field of Classification Search
CPC .............. H04B 17/0007; H04B 17/12; G01R 33/3607; G01R 33/5612; G01R 33/586
(Continued)

(56) References Cited

U.S. PATENT DOCUMENTS 5,522,390 A * 6/1996 Tuithof ............... G01R 33/563
324/309
2004/0095139 A1 * 5/2004 Brown ............... G01R 33/3415
324/309
(Continued)

FOREIGN PATENT DOCUMENTS

CN 1502984 A 6/2004
CN 1580806 A 2/2005
(Continued)

OTHER PUBLICATIONS

German Office Action dated Oct. 2, 2013 for corresponding German Patent No. DE 10 2013 206 570.1 with English translation.
(Continued)

*Primary Examiner* — Farhana Hoque
(74) *Attorney, Agent, or Firm* — Lempia Summerfield Katz LLC

(57) ABSTRACT

A method for operating a transmission device of a magnetic resonance device is provided. In order to actuate coil elements of a radiofrequency coil with different phases, phase differences in a reference plane are taken into consideration. In a first calibration measurement to be performed once for each transmission path, a first phase of a transmitted radiofrequency signal is measured by an internal measuring device installed permanently in the transmission device spaced apart from the reference plane. A second phase of the transmitted radiofrequency signal is measured by a second, external measuring device to be connected to the reference plane for the first calibration measurement. At least one phase of the first phase and the second phase is taken into (Continued)

consideration in the phase-accurate actuating of the coil elements and/or for correcting further measurements with the internal measuring device.

13 Claims, 1 Drawing Sheet

(51) Int. Cl.
*H04B 17/12* (2015.01)
*G01R 33/561* (2006.01)
*G01R 33/58* (2006.01)

(58) Field of Classification Search
USPC .................................................. 324/309, 318
See application file for complete search history.

(56) References Cited

U.S. PATENT DOCUMENTS

| | | |
|---|---|---|
| 2004/0199070 A1 | 10/2004 | Krockel |
| 2005/0035762 A1 | 2/2005 | Albrecht et al. |
| 2005/0140369 A1 | 6/2005 | Feiweier et al. |
| 2008/0205730 A1 | 8/2008 | Stehning et al. |
| 2008/0211501 A1 | 9/2008 | Graesslin et al. |
| 2011/0227574 A1 | 9/2011 | Akita et al. |
| 2011/0295531 A1 | 12/2011 | Nistler |
| 2012/0153951 A1 | 6/2012 | Kozlov et al. |
| 2012/0249143 A1* | 10/2012 | Umeda ............ G01R 33/56518 324/309 |
| 2013/0069650 A1* | 3/2013 | Abe .................. G01R 33/4833 324/309 |
| 2014/0132266 A1 | 5/2014 | Soejima et al. |

FOREIGN PATENT DOCUMENTS

| | | |
|---|---|---|
| CN | 101171527 A | 4/2008 |
| CN | 102188243 A | 9/2011 |
| CN | 102727203 A | 10/2012 |
| DE | 102010029463 A1 | 12/2011 |
| JP | 2004170424 A | 6/2004 |
| JP | 2004530518 A | 10/2004 |
| JP | 2008538968 A | 11/2008 |
| JP | 2012024306 A | 2/2012 |
| JP | 2014079572 A | 5/2014 |
| WO | WO2011065532 A1 | 6/2011 |

OTHER PUBLICATIONS

Chinese Office Action for related Chinese Application No. 201410142705.7 dated Jun. 12, 2016 with English Translation.
Japanese Office Action for Japanese Application No. 2014-082767, dated Feb. 5, 2018.

* cited by examiner

OPERATION OF A TRANSMISSION DEVICE OF A MAGNETIC RESONANCE DEVICE

This application claims the benefit of DE 10 2013 206 570.1, filed on Apr. 12, 2013, which is hereby incorporated by reference.

BACKGROUND

The present embodiments relate to operation of a transmission device of a magnetic resonance device.

In magnetic resonance imaging, it has been proposed to configure transmission coils (e.g., radiofrequency coils) such that the transmission coils include different coil elements that may be actuated independently of one another. If it is known which magnetic fields are produced by which coil element, different excitation patterns in the imaging range may thus be produced (e.g., volume-selective excitations or the like). For this purpose and also in order to compensate for lighter or darker points in images as a result of reflections, for example, or the like, provision may be made for defined phase differences between the individual channels defined by transmission paths to be produced in order to realize interferences.

In order to realize such multichannel radiofrequency transmission systems, a corresponding transmission device has been proposed that allows independent actuation of the coil elements. The entire multichannel radiofrequency transmission system in this case may be referred to as pTX or Tx array system, where "pTX" stands for "parallel transmit".

Overall, the distribution of the B1 field that is to be used for exciting the nuclear spin within an object to be recorded, and of the electrical field that is decisive for the SAR loading of the object may be controlled by changing the phase differences and amplitude ratios between the individual channels or transmission phases.

For the clear definition of the phase differences, a reference point for all transmission paths is to be provided. Therefore, overall, a reference plane is provided in general by the plug-in locations for the individual coil elements in the case of a magnetic resonance device. Different cable lengths to the coil elements and different properties of the coil elements may otherwise be taken into consideration since manufacturers of such radiofrequency coils and coil elements include a model of the coil elements that is taken into consideration in the actuation.

Transmission devices for multichannel radiofrequency transmission systems may have, in each transmission path, a modulator that generates the desired radiofrequency signals as low-level signal, with, in each case, one radiofrequency amplifier being connected downstream of the modulator. The radiofrequency amplifier amplifies the radiofrequency signal to the desired amplitude. The signal amplified in this way is passed on to the plug-in location of the coil. For correct actuation (e.g., in the context of magnetic resonance imaging), it is relevant that the correct input phase differences are set already at the modulators in order to obtain the correct desired target phase differences in the reference plane. In addition, reliable checking by virtue of measurement may be possible with respect to whether the correct phase differences are present. However, there are a few problems in this case.

SUMMARY AND DESCRIPTION

The scope of the present invention is defined solely by the appended claims and is not affected to any degree by the statements within this summary.

There are the following factors with respect to radiofrequency multichannel transmission systems that are desirable, for example, when applied to patients in magnetic resonance for increasing safety.

The actuation of the individual transmission paths is to take place such that there is a defined phase difference between the channels in the reference plane of the transmission path. As a result of such phase-accurate actuation, it is possible to produce predetermined interference patterns using a transmission array (e.g., a radiofrequency coil with independently actuatable coil elements). In this case, there is the problem that the different modulators in the individual transmission paths may not produce radiofrequency signals in phase with one another. The problem may also occur whereby the phase differences between the modulators change when the system is restarted. Synchronization of the modulators may be provided, but is technically extremely complex. Further, phase shifts between the transmission paths, based on the reference plane, may result from different cable lengths or cable properties and from variations in the radiofrequency amplifier devices.

The transmitted radiofrequency signals (e.g., pulses) for each transmission path are intended to be detected with phase accuracy in relation to the reference plane of the transmission path. This is desirable, for example, with respect to the realtime monitoring of the transmitted pulses in order to be able to perform a disconnection in the event of a malfunction of a component in the transmission system. This, for example, prevents an excessively high local or global SAR entry into the patient or the like.

In this case, too, various problems are known. The radiofrequency detectors (e.g., the measuring devices that may include directional couplers (DICOs)) may not be arranged directly in the reference plane for which the phases are intended to be measured. This is a problem, for example, with respect to the magnetic resonance application since the directional couplers may not be integrated in the plug-in location for the coil, but may be arranged outside the patient area of a magnetic resonance device, where a very long cable is provided between the plug-in location and the directional coupler. In addition, another cable may be provided between the directional coupler and a receiver, which may have a demodulator and an analog-to-digital converter (ADC). It appears that, in addition to a poorly calibrated directional coupler, the cables between the directional coupler and the receiver and the receiver itself may also effect different phase shifts from transmission path to transmission path. On restarting of the receivers, similarly to the modulators, sudden phase changes may result, which provides that the detected phase difference between two arbitrary transmission paths changes when the input signal is the same. In this case, too, synchronization of the receivers may be forced, but this entails a high degree of complexity in terms of design and cost.

It is desirable to detect defects (e.g., cable breakages) in the transmission path of individual channels (e.g., in the section between a measuring device and the coil element itself). This is because, in radiofrequency multichannel transmission systems, failure of a coil element or channel may result in relevant changes in field. The cable region between the measuring devices (e.g., radiofrequency detectors) and the coil element is important since a breakage at this point results indirectly in a signal decay at the measuring device, which may include a directional coupler.

The present embodiments may obviate one or more of the drawbacks or limitations in the related art. For example, a method for operating a transmission device and a transmission device that enable phase-accurate transmission and checking of the phase differences are provided.

In one embodiment, in a first calibration measurement to be performed once, for each transmission path, a first phase of a transmitted radiofrequency signal is measured by an internal measuring device installed permanently in the transmission device spaced apart from the reference plane. A second phase of the transmitted radiofrequency signal is measured by a second, external measuring device to be connected to the reference plane (e.g., the plug-in location) for the calibration measurement. At least one phase of the first phase and second phase is taken into consideration in the phase-accurate actuating of the coil elements and/or for correcting further measurements with the internal measuring device.

In the context of one or more of the present embodiments, it has been identified that, although it is not possible for a measuring device to be positioned in the reference plane (e.g., the plug-in location for the coil elements), when the transmission device is in a conventional operating mode, during a calibration measurement for the transmission device in which an additional external measuring device is used that is associated with a dedicated, fixed receiver, the arrangement of a measuring device in the reference plane is entirely possible. Since the transmission device has the same response irrespective of the transmission path, and therefore the plug-in location to which the transmission path is connected, the transmission device provides an unchangeable reference against which all transmission paths may be compared. Therefore, the measurement procedure of the first calibration measurement in accordance with one or more of the present embodiments is such that the external measuring device is connected to a transmission path for which a measurement is intended to be performed. A predetermined radiofrequency signal (e.g., test pulse) is generated in the transmission path, and a phase measurement is performed both by the internal measuring device and by the external measuring device. Therefore, the first phase and the second phase are measured. The first phase and the second phase for the transmission path are stored, and the next transmission path is measured until there are tuples for each transmission path. The difference between the first and the second phase indicates how the phase measured at the internal measuring device deviates from the phase at the reference plane in general (e.g., images cable lengths or the like).

Therefore, in a specific configuration of one or more of the present embodiments, provision may be made for, for each transmission path, a correction value to be determined from the difference between the first phase and the second phase and to be subtracted from following measurements (or the picked-up measured values) with the internal measuring device in order to determine the present phase at the reference plane. Therefore, the phase may be determined in the reference plane, and therefore, the correct phase differences may be determined in the reference plane.

In addition, however, the external measuring device, which is the same for each channel (e.g., transmission path) provides the possibility of matching the phases in the reference plane since, in each transmission path, the radiofrequency signal is generated with the same actuation phase. Therefore, the second phases indicate the differences that develop in the reference plane owing to the differences in the transmission paths.

Therefore, in an advantageous configuration of one or more of the present embodiments, the second phase may be subtracted from a target phase for determining an actuation phase, with which a radiofrequency signal is generated in order to obtain the target phase at the reference plane. This provides, therefore, that if target phases in the reference plane are known in order to obtain specific interferences, the second phase indicates how the modulator is to be actuated in order to obtain the corresponding target phases. There are phase differences in the reference plane since a clear "zero phase" is not generally defined. Therefore, target phases may ultimately be determined with respect to a reference transmission path (e.g., the first transmission path). Taking into consideration the second phases, the desired phase difference in the reference plane results.

At least when no complex electronics are provided in order to synchronize the modulators or receivers of the internal measuring devices, during the measurement of the entire transmission paths, restarting of the system of the transmission device may be ruled out in order to avoid sudden changes in phase of the modulators and receivers, which will be discussed in more detail below.

Apart from the connection of the external measuring device, all of the acts in the method according to one or more of the present embodiments may be performed automatically. For example, a user may be guided through the first calibration measurement by being provided with information with respect to the plug-in location to which the external measuring device is to be connected. The user, having connected the external measuring device, may confirm this. The measurements are performed automatically and, as a result, a new instruction for the next transmission path is output. In one embodiment, a dummy load may be connected downstream of the external measuring device (e.g., a 50Ω termination), which simulates an ideal coil element, and reflected components of the radiofrequency signal that is used for the calibration may be avoided.

One or more of the present embodiments therefore propose a calibration, monitoring and actuation method, with the aid of which the phase-accurate transmission and detection of radiofrequency pulses/radiofrequency signals in a multichannel radiofrequency transmission system may be provided. This has significance for the control of radiofrequency multichannel transmission systems in magnetic resonance devices and for monitoring the local SAR produced in the patient. The procedure described is independent of the radiofrequency coil used or of the coil elements used. The procedure may be realized for any desired number of transmission paths. In addition, the procedure may be realized easily and at low cost.

In a further advantageous configuration of one or more of the present embodiments, one directional coupler, which is connected to a receiver having an analog-to-digital converter, may be used as the internal and the external measuring device in each case. In addition to the analog-to-digital converter, the receiver may also receive a demodulator. The measured values picked up via the receiver (e.g., the phases) are passed on as digital signals to a control device of the transmission device, which evaluates and reuses the signals correspondingly, as described. Such measuring devices for phases (and possibly, in addition, amplitudes) of radiofrequency signals are already well known in the prior art and do not need to be illustrated in any more detail here.

In one embodiment, the receiver that is associated with the external measuring device and, for example, is installed permanently in the transmission device may be used exclusively for the external measuring device. In order that the external measuring device is as independent as possible and is the same for each transmission channel, a special receiver is used for the external measuring device. The receiver is permanently associated with the external measuring device and may also be permanently installed in the transmission device, with the result that the measurement results may be passed on directly to a control device of the transmission device, and components to be connected manually may be reduced.

While in one embodiment, the receivers of the internal measuring devices may only be permanently associated with the internal measuring devices, the receivers for the internal measuring devices may also be used for receiving magnetic resonance signals with the radiofrequency coil. Then, as is known in principle from the prior art, a reception path may be realized for each transmission path. Switchover may be performed between transmission and reception via a switching device. Transmitted signals pass through the directional coupler as usual. On reception, reception signals pass through a switching matrix and are passed on to the receivers.

In one embodiment of the method, as part of the first calibration measurement (e.g., in the case of a connected radiofrequency coil), a clearly defined test signal is transmitted on each transmission path, and for each test signal, the amplitude and the phase of the forward and the return test signal are measured by the internal measuring device and stored as check values, wherein. At at least one later point in time in a check measurement with the same configuration (e.g., in turn with the radiofrequency coil connected), for each transmission path, the test signal is transmitted again, and for each test signal, the amplitude and the phase of the forward and the return test signal are measured by the internal measuring device. In the event of a discrepancy in the check values for a transmission path, a cable fault is established and output. In this way, cable breakages between the internal measuring devices and the coil elements may, with the method according to one or more of the present embodiments, be identified, for example. For this reason, in the context of the first calibration measurement, a reference measurement is also performed. In this case, a predefined test signal is transmitted on each channel (e.g., each transmission path) in order. The phase and the amplitude of the forward and return wave of the transmission path are detected and stored (e.g., for this purpose, two receivers may be connected to each directional coupler of an internal measuring device, with the result that the forward and the return waves may be detected). The reference measurement thus described may take place with a connected radiofrequency coil, but also with an open transmission cable termination. In response to a trigger (e.g., restarting of the transmission device), a check measurement may be performed fully automatically. For this purpose, similarly to the reference measurement in the context of the first calibration measurement, the predefined test signal is output via all transmission paths in order. The amplitude and the phase are measured again. It has been shown that, for example, the phase has a very sensitive response to cable length changes as a result of breakages or the like. If the transmission path between the internal measuring device (e.g., a directional coupler) and the coil element is damaged, the amplitude and phase of the return wave change. If a cable between an amplification device and the directional coupler is damaged, even the amplitude and the phase of the forward wave are changed. Therefore, as a result of a comparison of the phase and/or amplitude with the check values picked up during the reference measurement, whether and where there is a cable fault may be established. The measuring arrangement is to be the same as the reference measurement, and therefore, the same radiofrequency coil may be connected, or open cable ends (e.g., unplugged coil) are present. In so far as the automatic triggering of the check measurement (e.g., comparison measurement) is concerned, whether a coil and which coil is connected to the transmission device may be detected. If there is operation with open ends of the transmission paths, the check measurement may be implemented directly after starting the transmission device, prior to connection of radiofrequency coils. During these measurements of phase and amplitude, already the corrections have been used based on the first and second phases, as described above. When there is operation with the radiofrequency coil connected, the coil load is to be the same as the reference measurement, which may be provided by an unloaded coil in the case of magnetic resonance devices.

During restarting of the transmission device, different phases of the modulators and receivers of the internal measuring devices may occur. This may be counteracted by an extremely complex synchronization device that is difficult to implement. In the case of the provision of such a synchronization device, the results of the first calibration measurement may be reused continuously unchanged. However, this is less preferred since considerable complexity is involved. It is less desirable for it to be necessary to implement the first calibration measurement again after each restart of the transmission device since every time this would require the connection of the external measuring device for each transmission path.

In order to solve these problems, an advantageous development provides that in each case, one modulator is used to generate signals on the transmission paths, and the internal measuring devices each have one of or the receiver. During the first calibration measurement, the phases of all of the receivers are compared with the phase of a predetermined reference modulator of the modulators, and the discrepancies are stored as receiver reference phases (e.g., act a), and/or the phases of all of the modulators are compared with the phase of a predetermined reference receiver, and the discrepancies are stored as modulator reference phases (e.g., act b). During a second calibration measurement following restarting of the transmission device, the phases of all of the receivers are compared with the phase of the predetermined reference modulator of the modulators, and the discrepancies are stored as present receiver phases (e.g., act a), and/or the phases of all of the modulators are compared with the phase of the predetermined reference receiver, and the discrepancies are stored as present modulator phases (e.g., act b). After every second calibration measurement, in the case of the phase-accurate actuating and/or correction, for each transmission path, at least one of the differences between the present receiver phase and the receiver reference phase and between the present modulator phase and the modulator reference phase is taken into consideration (e.g., the difference between the present receiver phase and the receiver reference phase is added to the correction value determined as the difference between the first phase and the second phase, and/or the difference between the present modulator phase and the modulator reference phase is also subtracted from the target phase for determining the actuation phase).

One or more of the present embodiments make it possible to take into consideration, in addition, sudden changes in phase of modulators or receivers on restarting of the transmission device using a second calibration measurement that takes place automatically each time the transmission device is restarted, when, during the first calibration measurement, reference values have been picked up. Therefore, the relative phases of the modulators and/or receivers for which the first and second phases have been picked up are known. Therefore, the correction or actuation operations may be modified suitably with the knowledge of a further shift that has possibly occurred, without an extremely complex synchronization device being required. In one embodiment, in each case, a fixed receiver may be used as comparison in order to establish phase differences in the modulators and to use, in each case, a fixed modulator for comparison in order to establish phase differences in the receivers. Thus, a fixed reference that enables a comparison of the modulator reference phase and the present modulator phase or the receiver reference phase and the present receiver phase is provided. Therefore, after every restart of the transmission device, acts a) and b) of the first calibration measurement, which may also be referred to as a "tune-up" measurement to be performed once, are to be repeated in order to thus determine the present phases.

The second calibration measurement may be performed automatically every time the transmission device is restarted. Suitable switching devices may be provided for the corresponding "measurement paths" within the transmission device. The switching devices may also be actuated automatically by a control device of the transmission device in order to enable the measurement.

In one embodiment, in order to determine the receiver reference phases and the present receiver phases, a comparison signal of the determined reference modulator is distributed among the receivers using a splitter. Similarly, in one embodiment, in order to determine the modulator reference phases and the present modulator phases, the comparison signal of the modulators is passed on to the specific reference receiver via a combiner. In addition, suitable switching devices are provided in the corresponding paths in order to be able to implement the second calibration measurement in automated fashion without any manual interaction.

In addition to the method, one or more of the present embodiments also relate to a transmission device for a magnetic resonance device. The transmission device is configured for independently actuating a plurality of coil elements of a radiofrequency coil. For this purpose, the transmission device includes a plurality of transmission paths that each include a modulator, an amplifier device, an internal measuring device connected downstream of the amplifier device for measuring a first phase of a transmitted radiofrequency signal, and a plug-in location (e.g., considered as reference plane for a coil element of the reference coil). The transmission device also includes an external measuring device that may be connected to a plug-in location for measuring a second phase of a transmitted radiofrequency signal, and a control device configured to implement a method according to one or more of the present embodiments. All of the statements with respect to the method may be transferred analogously to the transmission device, with the result that the described advantages may also be obtained with this transmission device. For example, the described design configurations (e.g., the use of a combiner and/or a splitter) may be transferred without any problems to the transmission device according to one or more of the present embodiments. The transmission device may be part of a magnetic resonance device that has a radiofrequency multichannel transmission system with a radiofrequency coil including a plurality of independently actuatable coil elements. The control device may be configured, for the first calibration measurement, to guide a user through the first calibration measurement as regards operations that are to be performed by the user (e.g., connection/rearrangement of the external measuring device). For this purpose, suitable output devices may be provided, for example, or suitable switches that a user may activate after connection of the external measuring device or the like may be provided. All of the measurement acts in the method and also the second calibration measurement that may be implemented are triggered, started and performed automatically.

With respect to the detection of cable breakages or other cable damage, two instances of the reference measurement and the check measurement may be implemented (e.g., once with load and once without a load), with the result that there are two comparison possibilities.

DETAILED DESCRIPTION

Figure 1:
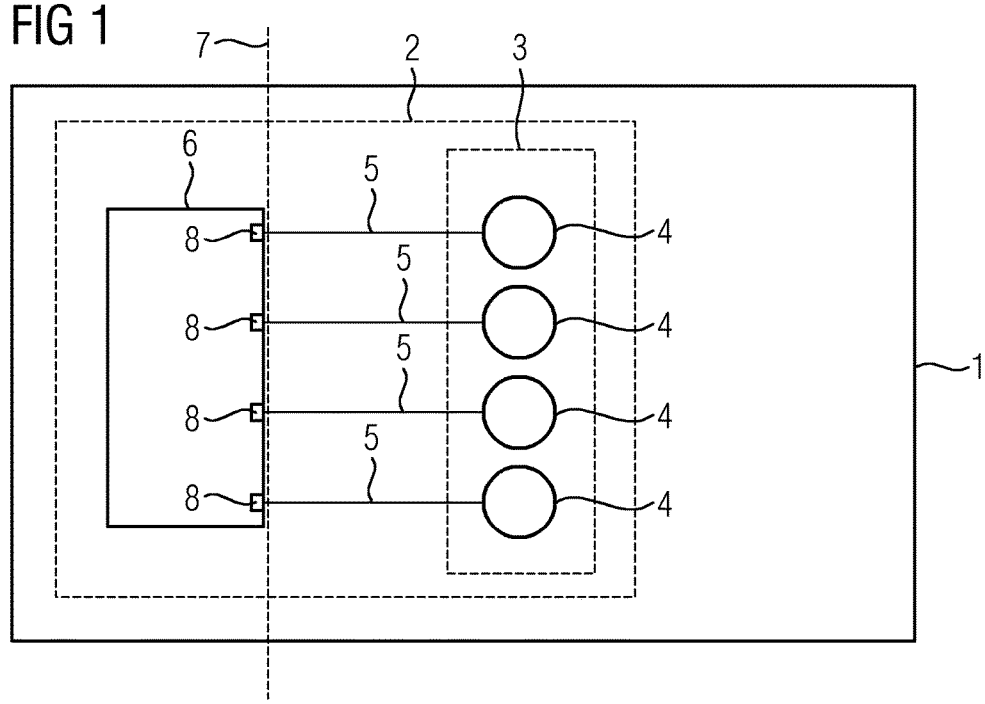
FIG. 1 shows one embodiment of a magnetic resonance device including a transmission device.

FIG. 1 shows one embodiment of a magnetic resonance device 1 that, as is not illustrated in more detail here for reasons of clarity, includes components that are conventional in the prior art. For example, a main magnet unit includes a superconducting main magnet. The main magnet unit defines a patient area, into which a patient couch may be inserted. In addition, a gradient coil arrangement is provided surrounding the patient area.

Radiofrequency signals for exciting the nuclear spins are generated by a radiofrequency multichannel transmission system 2 in the magnetic resonance device 1. The radiofrequency multichannel transmission system includes a radiofrequency coil 3 (e.g., a body coil that includes a plurality of independently actuatable coil elements 4). In one embodiment, with knowledge of the magnetic fields (e.g., may be measured and stored as B1 maps) produced by the individual coil elements 4, any desired excitations may be produced (e.g., the coil elements 4 are actuated with different phases with the result that a phase difference is formed and results in intentional interference in specific regions). Since the phase response of the coil elements 4 and corresponding cables 5 is already known in principle and may be supplied by the manufacturer of the coil elements 4 in the form of a model, this is not necessarily the case for the transmission device 6, which provides the radiofrequency signals to be transmitted via the coil elements 4. In order to allow phase-accurate actuation and checking of the correct phase differences, the phase differences at a reference plane 7, which, for example, is defined by the plug-in locations 8 of the transmission device 6, are to be known. One or more of the present embodiments deal with the calibration of the transmission device 6 with respect to possible phase differences during transmission and during the check measurement of transmitted radiofrequency signals and during use of the calibration information during conventional operation of the transmission device 6.

Figure 2:
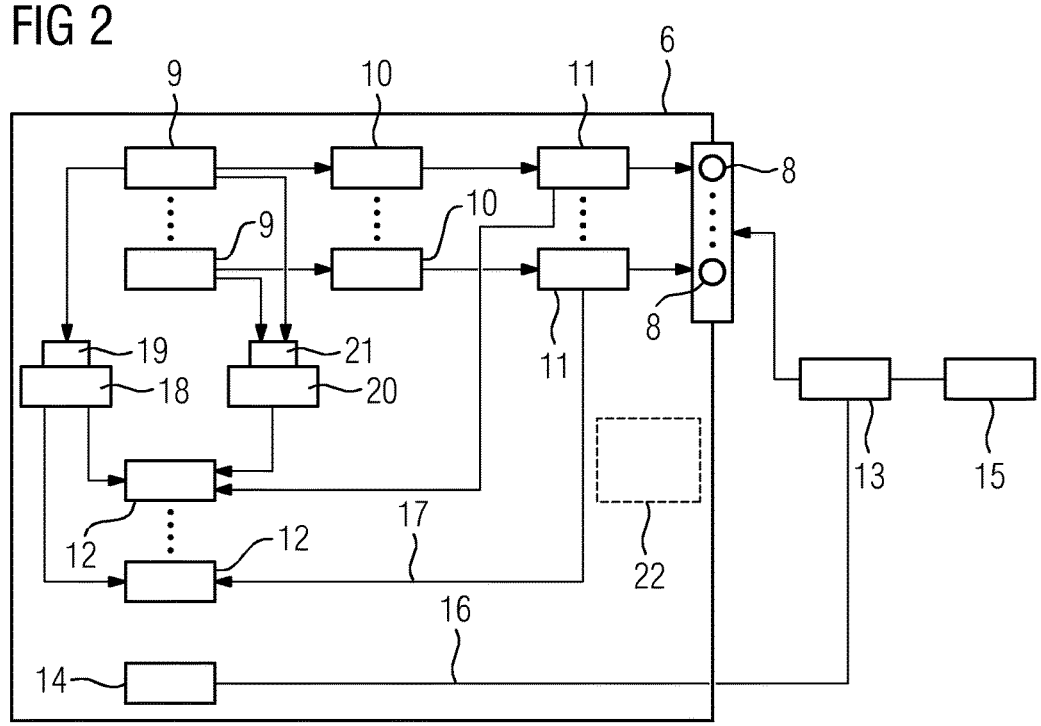
FIG. 2 shows one embodiment of a transmission device.

For this purpose, the structure of the transmission device 6 is illustrated in more detail with reference to FIG. 2. FIG. 2 shows the principle working relationships of different components, but does not reproduce a precise circuit diagram. The specific realization of this is possible for a person skilled in the art.

In the transmission device 6, a transmission path is provided for each channel (e.g., each coil element 4). In the transmission path, the radiofrequency signal is generated as a low-level signal by a modulator 9. The low-level signal is passed on to a radiofrequency amplifier device 10 and amplified at the radiofrequency amplifier device 10 to the desired amplitude. The radiofrequency signal thus amplified may be passed on to the plug-in location 8. In this case, the components are not shown for each of the n transmission paths but, for reasons of clarity, only for the first transmission path, i=1, and the last transmission path, i=n. The other components are indicated by corresponding dots.

Owing to the spatial and electromagnetic field conditions, in a magnetic resonance device 1, an internal measuring device that picks up the phase and amplitude of the radiofrequency signal may not be arranged directly at the plug-in location 8 (e.g., the reference plane 7). Therefore, a cable length between an internal measuring device and the plug-in location 8 that may be different from transmission channel to transmission channel is present, and in addition, there may be differences between the internal measuring devices themselves. In this case, the internal measuring devices connected downstream of the amplifier device 10 are realized in each case by a directional coupler 11 and a receiver 12. The receiver 12 contains a demodulator and an analog-to-digital converter.

The operation of the transmission device 6 is controlled via a control device 22 that also implements the method according to one or more of the present embodiments.

The method according to one or more of the present embodiments enables operation of the transmission device 6, which allows phase-accurate transmission and detection of radiofrequency pulses (e.g., radiofrequency signals) in a radiofrequency coil 3 including n coil elements 4. For this purpose, a series of calibration measurements is performed. These calibration measurements may be divided into a first calibration measurement (e.g., tune-up) that only is to be performed once, and second calibration measurements that are to be performed each time the transmission device 6 is restarted and will overall be illustrated in more detail below.

When the transmission device 6 is first connected, after wiring between the components of the transmission device 6, the following measurements are performed once. Prior to completion of the measurements, no system restart of the transmission device 6 is performed in order to avoid sudden changes in phase of the modulators 9 and the receivers 12.

An external measuring device that has a directional coupler 13 and a receiver 14, which is, for example, installed permanently in the transmission device 6, is used for a first submeasurement of the first calibration measurement performed at the beginning. The component with the directional coupler 13 may be connected directly in the plug-in locations 8, with the result that the phase may actually be measured in the reference plane 7. In this case, a 50Ω termination 15 ("dummy load") is used, which defines an ideal coil. In one embodiment, via the external measuring device, the phases may be measured for all transmission paths at the reference plane 7 since the external measuring device may be connected successively to all plug-in locations 8. Since the measurements are performed with the same external measuring device, the phases are comparable. The modulators 9 are actuated with the same phase (e.g., a predetermined radiofrequency signal (test pulse) for each measurement).

The measurement procedure is as follows. The external directional coupler is connected to the plug-in location 8 of the i-th transmission path. A predetermined radiofrequency signal is transmitted, and the phase $\alpha_i$ is measured at the external directional coupler 13 via the receiver 14 and thus via the signal path 16. The phase $\alpha_i$ will be referred to below as the second phase. The second phases $\alpha_i$ are stored and may be used afterwards in order to calculate a corrected actuation phase $\varphi_{c,i}$, with which the i-th modulator 9 is to be actuated in order to obtain the target phase $\varphi_{z,i}$ in the reference plane 7. The target phase $\varphi_{z,i}$ results from desired phase differences. This provides that when the target phases $\varphi_{t,i}$ are known, the control device 22 may first calculate the actuation phase for each transmission path i, as long as still no system restart has been performed:

$$\varphi_{c,i} = \varphi_{t,i} - \alpha_i$$

In the first submeasurement, however, a first phase $\beta_i$ is also measured at the internal directional coupler 11 of the internal measuring device for the predetermined radiofrequency signal (e.g., test pulse). The first phase and the second phase are measured for all n transmission channels. In this case, user support may be implemented by actuation of an output device by the control device 22, which may give instruction, for example, to connect the external measuring device (e.g., the directional coupler 13) to a specific plug-in location and then to actuate an operating element in order to indicate measurement readiness.

If the first and second phases are known, further measurements at the directional couplers 10 (e.g., at least up to a system restart) may also be converted such that the phase is obtained at the reference plane 7. If the phase measured at the i-th directional coupler 11 is denoted by $\psi_{m,i}$, a correction is to be made by the control device 22 in order to obtain the phase $\psi_{s,i}$ at the associated plug-in location 8, as follows:

$$\Psi_{s,i} = \alpha_i - (\beta_i - \psi_{m,i}) = \psi_{m,i} - (\beta_i - \alpha_i)$$

The value $(\beta_i - \alpha_i)$ is therefore a correction value, which is likewise stored in the control device 22.

The operating method according to one or more of the present embodiments does, however, also take into consideration further effects (e.g., the fact that the phase relationships between different modulators 9 and different receivers 12 no longer need to be the same as in the case of the first calibration measurement after restarting of the transmission device 6, and the possibility of cable breakages, with the result that further submeasurements in the context of the first calibration measurement are performed). Once, therefore, the first phase $\beta_i$ has been measured over the signal path 17 and the second phase $\alpha_i$ has been measured over the signal path 16, the external measuring device is again removed from the coil plug-in locations 8, and the phases of all of the receivers 12 are compared, as second submeasurement, with a uniform reference signal always from the same modulator 9. The discrepancies are stored as receiver reference phases $\gamma_i$. For this purpose, the transmission device 6 has a splitter 18 that may be connected via a corresponding switching device 19 for the purpose of the second submeasurement by the control device 22. The splitter 18 distributes the signal of the fixed, predetermined reference modulator 9 amongst the receivers 12, with the result that the determination of $\gamma_i$ may take place. The receiver reference phases $\gamma_i$ are stored.

In a third submeasurement, the phases of all of the modulators 9 are compared with the phase of a fixed, predetermined reference receiver 12. The discrepancies are stored as modulator reference phases $\delta_i$. For this purpose, a combiner 20 that also has an associated corresponding switching device 21 actuatable by the control device 22 is used. The actual measurement then takes place in the reference receiver 12. The stored values $\gamma_i$ and $\delta_i$ are used later, after a restart of the transmission device 6 and the second calibration measurement, in order to be able to establish sudden changes in phase of the individual modulators 9 or receivers 12.

A fourth submeasurement that is performed by the internal measuring device (e.g., at the directional couplers 11) also takes place. In this case, the above-described correction value ($\beta_i-\alpha_i$) is already used. In order to be able to establish, at a later point in time, cable breakages or other cable damage, a clearly defined test signal is transmitted on each transmission path. A clearly defined load situation according to the plug-in location 8 is also provided, however, whether it be an open end or the already connected coil elements 4 of the radiofrequency coil 3. For this test signal, the amplitude and the phase of the forward and return test signal are measured by the internal measuring device. Correspondingly, the receivers 12 symbolize devices for the forward and return waves. The amplitudes and phases of the forward and return test signal are stored as check values for each transmission path.

Thus, the first calibration measurement is completed during tune-up, and the operation of the transmission device 6 may be resumed. In accordance with the two formulae above, actuation phases and corrected measured values relating to the reference plane 7 are obtained.

A second calibration measurement is performed after restarting of the transmission device 6. This is because, after a restart, the phases $\delta_i$ of the modulators 9 and the phases $\gamma_i$ of the receivers 12 may change. Therefore, in the second calibration measurement, the second and third submeasurements of the first calibration measurement are repeated automatically (e.g., without the intervention of operating personnel being required), with the result that values $\delta^*_i$ and $\gamma^*_i$ result. The automated implementation of the measurements is produced by the use of the actuatable or programmable switching devices 19, 21. Such a switching device may also be provided for the signal path 17.

If the present receiver phases $\gamma^*_i$ and the present modulator phases $\delta^*_i$ are known first, the sudden changes in phase that may be present at the modulators 9 and the receivers 12 may also be taken into consideration, and the following results for the correct actuation phase $\varphi_{c,i}$:

$$\varphi_{c,i}=\varphi_{t,i}-\alpha_i-(\delta^*_i-\delta_i).$$

Correspondingly, the formula with which the phases in the reference plane 7 may be determined from the phases at the directional couplers 11 is updated as follows:

$$\Psi_{s,i}=\Psi_{m,i}-(\beta_i-\alpha_i)-(\gamma^*_i-\gamma_i).$$

In addition, after a restart of the transmission device 6, the system 2 is tested for broken transmission cables. While producing the same circumstances as in the fourth submeasurement of the first calibration measurement (e.g., similar to the tune-up measurement), the clearly defined test signal in a check measurement is transmitted on all transmission paths in order. The phases and amplitudes of the forward and return test signal are measured again after application of the corrections for all transmission paths and compared with the check values. If there is a cable breakage or cable damage between the amplifier device 10 and the directional coupler 11, the amplitude and the phase of the forward wave are changed. If there is a cable breakage or cable damage between the directional coupler 11 and the coil plug-in location 8 in the case of an open end or the coil element 4 in the case of a connected radiofrequency coil 3, the amplitude and the phase of the return wave are changed. Cable length changes are easily identifiable from the phase. If a fault is established, the operation of the transmission device 6 and therefore of the entire radiofrequency multichannel transmission system 2 is interrupted.

Whether a radiofrequency coil 3 and/or which radiofrequency coil 3 is connected to the plug-in locations may be established using detection apparatuses that are known in principle from the prior art. Submeasurements of the two calibration measurements that relate to the check values may be implemented a plurality of times for different load or connection states. Thus, it is possible to distinguish, for example, whether there is a problem in the cable from the plug-in location to the coil element 4 or within the transmission device 6.

Although the invention has been illustrated and described in detail by the exemplary embodiments, the invention is not restricted by the disclosed examples, and other variations may be derived from this by a person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a transmission device of a magnetic resonance device, the transmission device being configured to independently actuate a plurality of coil elements of a radiofrequency coil over different transmission paths, wherein phase differences in a reference plane are taken into consideration to actuate the plurality of coil elements with different phases, the method comprising:

measuring, by an internal measuring device installed permanently in the transmission device spaced apart from the reference plane, a first phase of a transmitted radiofrequency signal in a first calibration measurement performed once for each transmission path;

measuring, by an external measuring device to be connected to the reference plane, a second phase of the transmitted radiofrequency signal for the first calibration measurement; and determining, for each transmission path, a correction value from a difference between the first phase and the second phase and subtracting the determined correction value from following measurements with the internal measuring device in order to determine a present phase at the reference plane, subtracting, for each transmission path, the second phase from a target phase for determining an actuation phase, with which a radiofrequency signal is generated in order to obtain the target phase at the reference plane, or a combination thereof, wherein at least one phase of the first phase and the second phase is taken into consideration in the phase-accurate actuating of the plurality of coil elements, for correcting further measurements with the internal measuring device, or a combination thereof.

2. The method of claim 1, wherein the reference plane is at plug-in location for the plurality of coil elements.

3. The method of claim 1, further comprising using, in each case, one directional coupler that is connected to a receiver having an analog-to-digital converter as the internal measuring device and the external measuring device.

4. The method of claim 3, wherein the receiver that is associated with the external measuring device and is installed permanently in the transmission device is used exclusively for the external measuring device.

5. The method of claim 3, wherein the receivers for the internal measuring devices are also used for receiving magnetic resonance signals with the radiofrequency coil.

6. The method of claim 3, further comprising:
generating signals on the transmission paths using one modulator in each case, wherein the internal measuring devices each include one of the modulators or the receiver;
during the first calibration measurement, comparing the phases of all of the receivers with a phase of a predetermined reference modulator of the modulators and storing discrepancies as receiver reference phases, comparing the phases of all of the modulators with a phase of a predetermined reference receiver of the receivers and storing discrepancies as modulator reference phases, or a combination thereof;
during a second calibration measurement following restarting of the transmission device, comparing the phases of all of the receivers with the phase of the predetermined reference modulator, and storing discrepancies as present receiver phases, comparing the phases of all of the modulators with the phase of the predetermined reference receiver and storing discrepancies as present modulator phases, or a combination thereof,
wherein, after every second calibration measurement, in the case of phase-accurate actuating, correction, or phase-accurate actuating and correction, for each transmission path, at least one of the differences between the present receiver phase and the receiver reference phase and between the present modulator phase and the modulator reference phase is taken into consideration.

7. The method of claim 1, further comprising:
transmitting a clearly defined test signal on each transmission path as part of the first calibration measurement;
measuring, for each test signal using the internal measuring device, an amplitude and a phase of a forward test signal and a return test signal, and storing the amplitude and the phase of the forward test signal and the return test signal as check values, wherein at at least one later point in time in a check measurement with the same configuration, for each transmission path, the test signal is transmitted again and, for each test signal, the amplitude and the phase of the forward and the return test signal are measured by the internal measuring device; and
establishing and outputting a cable fault when there is a discrepancy in the check values for a transmission path.

8. The method of claim 6, wherein the at least one difference is taken into consideration such that the difference between the present receiver phase and the receiver reference phase is added to the correction value determined as the difference between the first phase and the second phase, after every second calibration measurement, the difference between the present modulator phase and the modulator reference phase is subtracted from the target phase for determining the actuation phase, or a combination thereof.

9. The method of claim 6, wherein the second calibration measurement is performed automatically every time the transmission device is restarted.

10. The method of claim 6, further comprising determining the receiver reference phases and the present receiver phases, the determining comprising distributing a comparison signal of the determined reference modulator among the receivers using a splitter.

11. The method of claim 10, further comprising determining the modulator reference phases and the present modulator phases, the determining comprising passing the comparison signal of the modulators on to the specific reference receiver via a combiner.

12. A transmission device for a magnetic resonance device, the transmission device being configured for independently actuating a plurality of coil elements of a radiofrequency coil, the transmission device comprising:
a plurality of transmission paths, each transmission path of the plurality of transmission paths comprising:
a modulator;
an amplifier device;
an internal measuring device connected downstream of the amplifier device, the internal measuring device configured for measuring a first phase of a transmitted radiofrequency signal;
a plug-in location considered as reference plane for a coil element of the plurality of coil elements;
an external measuring device that is connectable to the plug-in location, the external measuring device configured for measuring a second phase of a transmitted radiofrequency signal; and
a control device configured to:
operate the transmission device;
measure, using the internal measuring device, which is installed permanently in the transmission device spaced apart from the reference plane, the first phase of the transmitted radiofrequency signal in a first calibration measurement performed once for each transmission path of the plurality of transmission paths; and
measure, using the external measuring device connected to the reference plane, the second phase of the transmitted radiofrequency signal for the first calibration measurement; and
take at least one phase of the first phase and the second phase into consideration in the phase-accurate actuating of the plurality of coil elements, for correcting further measurements with the internal measuring device, or a combination thereof,
wherein the transmission device is further configured to independently actuate the plurality of coil elements of the radiofrequency coil over the plurality of transmission paths, and
wherein the control device is configured to actuate the plurality of coil elements with different phases taking phase differences in the reference plane into consideration.

13. A method for operating a transmission device of a magnetic resonance device, the transmission device being configured to independently actuate a plurality of coil elements of a radiofrequency coil over different transmission paths, wherein phase differences in a reference plane are taken into consideration to actuate the plurality of coil elements with different phases, the method comprising:

measuring, by an internal measuring device installed permanently in the transmission device spaced apart from the reference plane, a first phase of a transmitted radiofrequency signal in a first calibration measurement performed once for each transmission path;

measuring, by an external measuring device to be connected to the reference plane, a second phase of the transmitted radiofrequency signal for the first calibration measurement;

transmitting a clearly defined test signal on each transmission path as part of the first calibration measurement;

measuring, for each test signal using the internal measuring device, an amplitude and a phase of a forward test signal and a return test signal, and storing the amplitude and the phase of the forward test signal and the return test signal as check values, wherein at at least one later point in time in a check measurement with the same configuration, for each transmission path, the test signal is transmitted again and, for each test signal, the amplitude and the phase of the forward and the return test signal are measured by the internal measuring device; and establishing and outputting a cable fault when there is a discrepancy in the check values for a transmission path, wherein at least one phase of the first phase and the second phase is taken into consideration in the phase-accurate actuating of the plurality of coil elements, for correcting further measurements with the internal measuring device, or a combination thereof.

* * * * *